(12) United States Patent
Hsu et al.

(10) Patent No.: US 12,014,992 B2
(45) Date of Patent: *Jun. 18, 2024

(54) SEMICONDUCTOR PACKAGE

(71) Applicant: Taiwan Semiconductor Manufacturing Company, Ltd., Hsinchu (TW)

(72) Inventors: Sen-Kuei Hsu, Kaohsiung (TW); Hsin-Yu Pan, Taipei (TW); Chien-Chang Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/984,195

(22) Filed: Nov. 9, 2022

(65) Prior Publication Data

US 2023/0061943 A1  Mar. 2, 2023

Related U.S. Application Data

(63) Continuation of application No. 16/914,480, filed on Jun. 29, 2020, now Pat. No. 11,508,666.

(51) Int. Cl.
| | | |
|---|---|---|
| *H01L 29/00* | (2006.01) | |
| *H01L 23/538* | (2006.01) | |
| *H01L 23/66* | (2006.01) | |
| *H01P 3/08* | (2006.01) | |
| *H03H 7/01* | (2006.01) | |

(52) U.S. Cl.
CPC ...... *H01L 23/5386* (2013.01); *H01L 23/5383* (2013.01); *H01L 23/66* (2013.01); *H01P 3/081* (2013.01); *H03H 7/0115* (2013.01); *H01L 2223/6627* (2013.01)

(58) Field of Classification Search
CPC ............ H01L 23/5383; H01L 23/5386; H01L 2223/6627; H03H 7/138
USPC .................................................. 257/531, 724
See application file for complete search history.

(56) References Cited

U.S. PATENT DOCUMENTS

| | | | | |
|---|---|---|---|---|
| 6,064,113 A * | 5/2000 | Kirkman | ................. | H01L 24/49 257/691 |
| 6,885,275 B1 * | 4/2005 | Chang | ..................... | H03J 3/185 336/200 |
| 7,791,210 B2 * | 9/2010 | Miller | ..................... | H01L 25/16 257/691 |
| 7,948,078 B2 * | 5/2011 | Hiraga | .............. | H01L 23/49531 257/784 |

(Continued)

*Primary Examiner* — Nitin Parekh

(74) *Attorney, Agent, or Firm* — JCIPRNET

(57) ABSTRACT

A semiconductor package is provided. The semiconductor package includes a semiconductor die, a stack of polymer layers, redistribution elements and a passive filter. The polymer layers cover a front surface of the semiconductor die. The redistribution elements and the passive filter are disposed in the stack of polymer layers. The passive filter includes a ground plane and conductive patches. The ground plane is overlapped with the conductive patches, and the conductive patches are laterally separated from one another. The ground plane is electrically coupled to a reference voltage. The conductive patches are electrically connected to the ground plane, electrically floated, or electrically coupled to a direct current (DC) voltage.

20 Claims, 11 Drawing Sheets

(56) References Cited

U.S. PATENT DOCUMENTS

| | | | |
|---|---|---|---|
| 2009/0015363 A1* | 1/2009 | Gardner | H01L 23/645 336/200 |
| 2012/0037969 A1* | 2/2012 | Sanders | H01L 28/10 257/296 |
| 2018/0286805 A1* | 10/2018 | Huang | H01L 23/5385 |

* cited by examiner

SEMICONDUCTOR PACKAGE

CROSS-REFERENCE TO RELATED APPLICATION

This application is a continuation application of and claims the priority benefit of a prior application Ser. No. 16/914,480, filed on Jun. 29, 2020. The entirety of each of the above-mentioned patent applications is hereby incorporated by reference herein and made a part of this specification.

BACKGROUND

Many integrated circuits are typically manufactured on a single semiconductor wafer. The dies of the wafer may be processed and packaged at wafer level, and various technologies have been developed for wafer level packaging. Over the past decades, the semiconductor industry has continually improved the processing capabilities by shrinking the minimum feature size. Signal integrity and power integrity become increasingly important to the performance and reliability of devices within a semiconductor package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
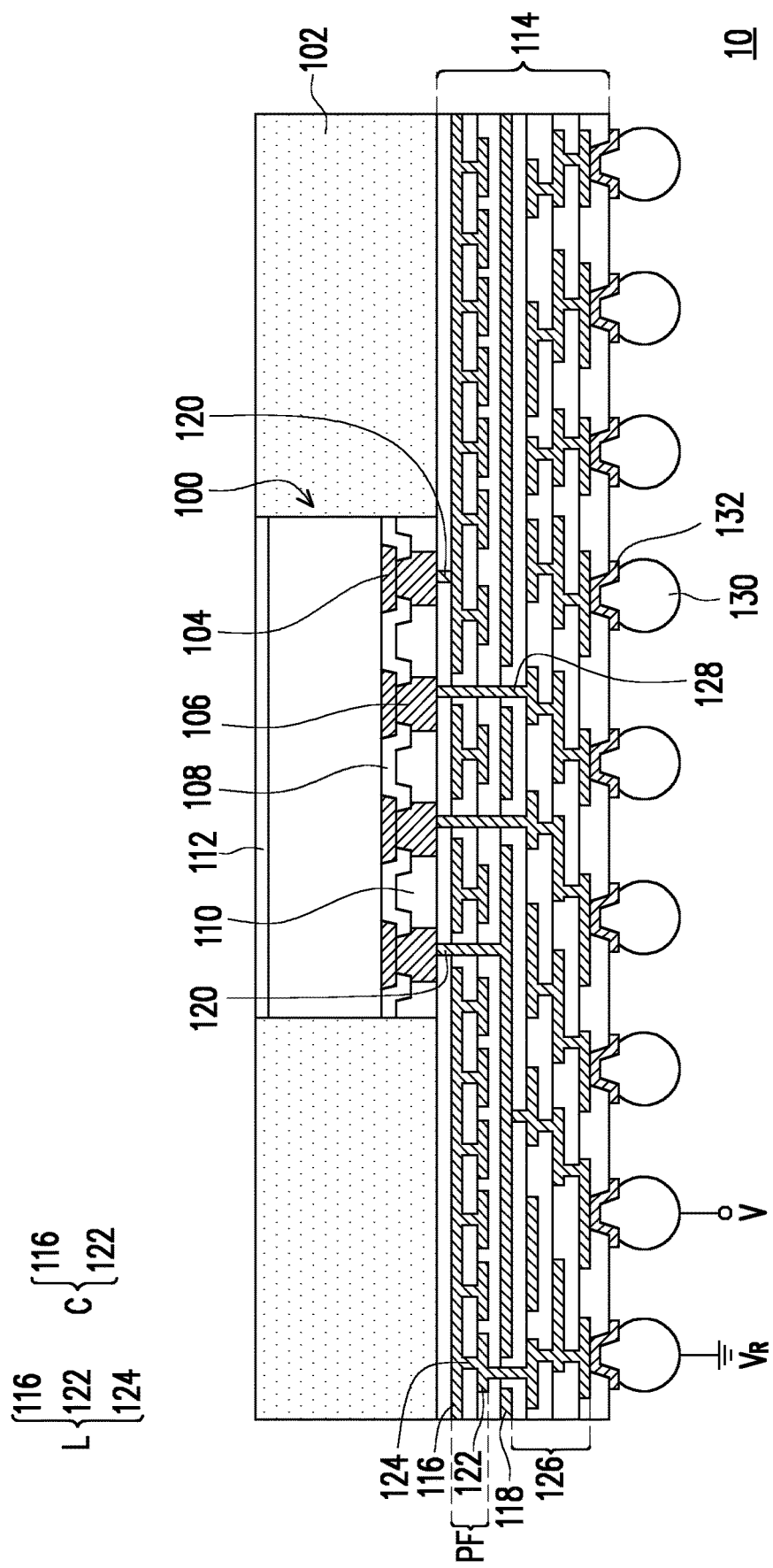
FIG. 1A is a schematic cross-sectional view illustrating a semiconductor package according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
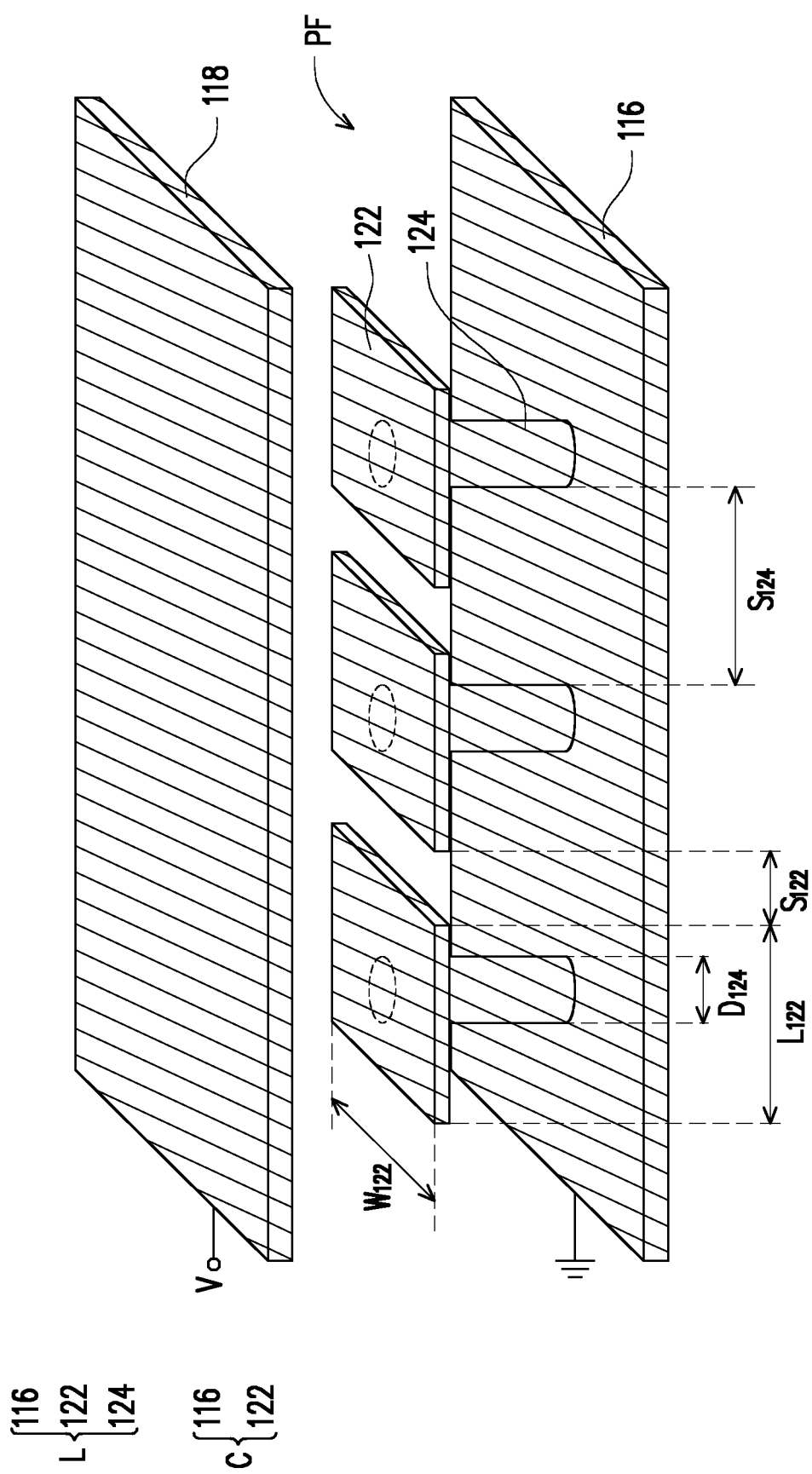
FIG. 1B is a schematic three-dimensional view illustrating the ground plane, the power plane, the conductive patches and the inter-patch vias as shown in FIG. 1A.
Figure 1C:
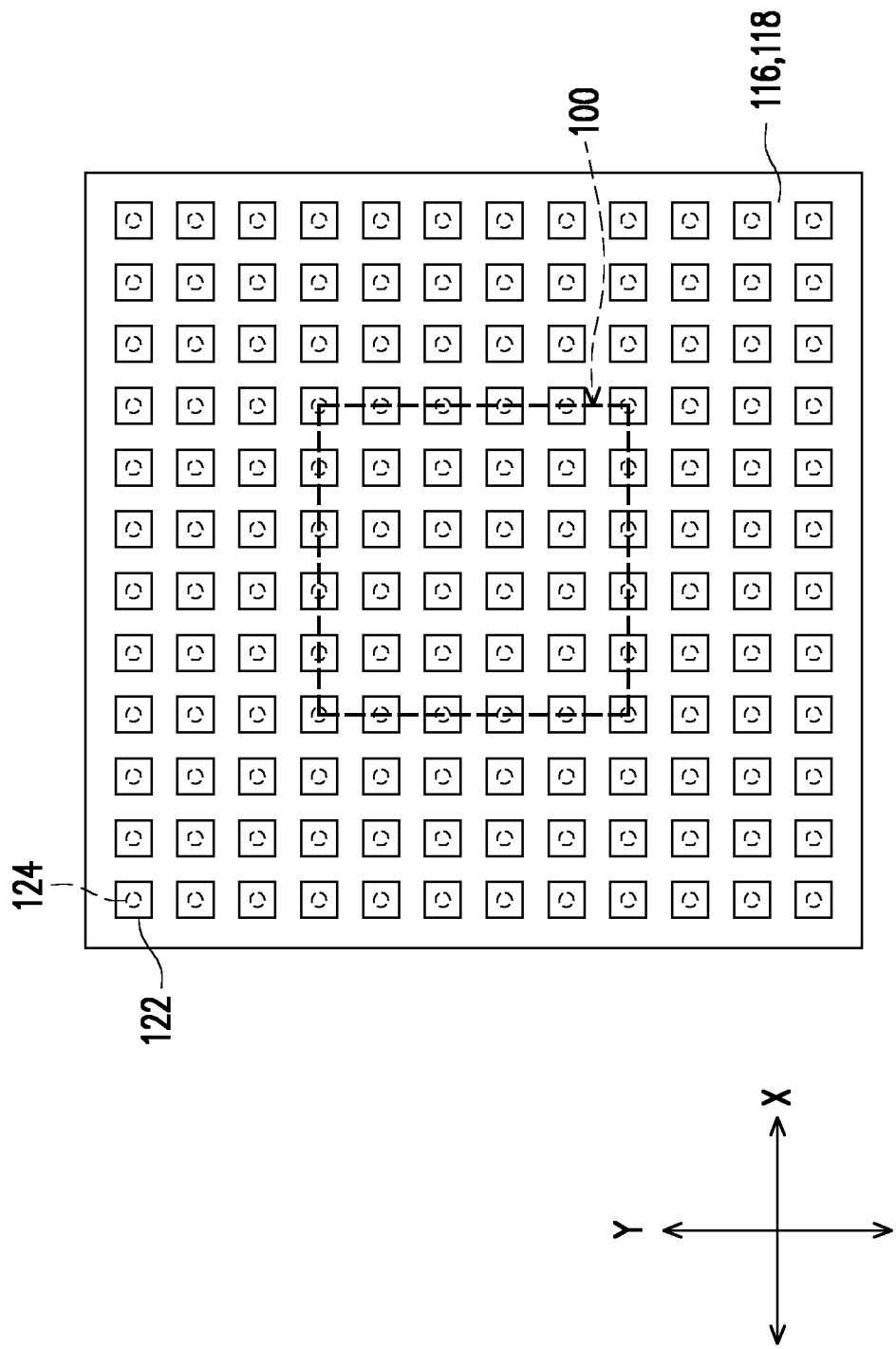
FIG. 1C is a schematic plane view illustrating the semiconductor die, the ground plane, the power plane and the conductive patches as shown in FIG. 1A.

FIG. 1A is a schematic cross-sectional view illustrating a semiconductor package 10 according to some embodiments of the present disclosure. FIG. 1B is a schematic three-dimensional view illustrating the ground plane 116, the power plane 118, the conductive patches 122 and the inter-patch vias 124 as shown in FIG. 1A. FIG. 1C is a schematic plane view illustrating the semiconductor die 100, the ground plane 116 and the conductive patches 122 as shown in FIG. 1A.

Referring to FIG. 1A, in some embodiments, the semiconductor package 10 is a fan-out semiconductor package. In these embodiments, the semiconductor package 10 includes a semiconductor die 100 and an encapsulant 102 laterally encapsulating the semiconductor die 100. The semiconductor die 100 is singulated from a device wafer, and may be, for example, a logic die, a memory die, a central processing unit (CPU) die, a micro-control unit (MCU) die, an application processor (AP) die or the like, the present disclosure is not limited to types of the semiconductor die 100. In alternative embodiments, two or more semiconductor dies 100 may be laterally encapsulated by the encapsulant 102, and these semiconductor dies 100 may be identical to or different from one another. The semiconductor die 100 has an active side at which electrical connectors are formed, and has a back side facing away from the active side. In some embodiments, the electrical connectors include conductive pads 104 and conductive pillars 106. The conductive pads 104 may be formed at a surface of an interconnection structure (not shown), and are electrically connected to the interconnection structure. In some embodiments, an insulating layer 108 may be formed over the conductive pads 104, and may have openings respectively overlapped with one of the conductive pads 104. In these embodiments, the conductive pillars 106 are disposed in these openings of the insulating layer 108, and are in electrical contact with the conductive pads 104. In addition, the conductive pillars 106 may be protruded from the insulating layer 108. In some embodiments, an insulating layer 110 may be further formed over the insulating layer 108. The conductive pillars 106 are laterally surrounded by the insulating layer 110, and the insulating layer 110 may have a front surface (e.g., a bottom surface as shown in FIG. 1A) substantially coplanar with front surfaces of the conductive pillars 106 (e.g., bottom surfaces of the conductive pillars 106 as shown in FIG. 1A). In addition, these front surfaces of the insulating layer 110 and the conductive pillars 106 may be substantially coplanar with a front surface of the encapsulant 102 (e.g., a bottom surface of the encapsulant 102 as shown in FIG. 1A). On the other hand, in some embodiments, an adhesive layer 112 may be disposed at the back side of the semiconductor die 100. In these embodiments, the adhesive layer 112 may have a back surface (e.g., a top surface as shown in FIG. 1A) substantially coplanar with a back surface of the encapsulant 102 (e.g., a top surface of the encapsulant 102 as shown in FIG. 1A). In other embodiments, the adhesive layer 112 may be omitted, and the back side of the semiconductor die 100 may be substantially coplanar with the back surface of the encapsulant 102 or covered by a portion of the encapsulant 102.

Referring to FIG. 1A and FIG. 1B, the semiconductor package 10 further includes a stack of polymer layers 114, and includes a ground plane 116 and a power plane 118 formed in the stack of polymer layers 114. The stack of polymer layers 114 cover the front surfaces of the encapsulant 102, the conductive pillars 106 and the insulating layer 110 (e.g., the bottom surfaces of the encapsulant 102, the conductive pillars 106 and the insulating layer 110 as shown in FIG. 1A). In some embodiments, a boundary of the polymer layers 114 is substantially aligned with a boundary of the encapsulant 102. The ground plane 116 and the power plane 118 formed in the stack of polymer layers 114 are respectively in electrical contact with one or more of the conductive pillars 106 through a conductive through via 120. The power plane 118 is configured to provide a working voltage V (e.g., a direct current (DC) voltage) to the semiconductor die 100, whereas the ground plane 116 is electrically coupled to a reference voltage $V_R$ (e.g., a ground voltage). The ground plane 116 and the power plane 118 are vertically separated from each other, and respectively formed as a large conductive plate. In some embodiments, the ground plane 116 and the power plane 118 are overlapped with almost the entire structure containing the semiconductor die 100 and the encapsulant 102. Alternatively, the ground plane 116 and the power plane 118 may locally cover the structure containing the semiconductor die 100 and the encapsulant 102. In some embodiments, as shown in FIG. 1A, the ground plane 116 is formed at a bottom surface of the topmost polymer layer 114, and the power plane 118 is formed at a bottom surface of the third top polymer layer 114. In addition, conductive through via(s) 120 connecting between the ground plane 116 and one or more of the conductive pillars 106 may penetrate through the topmost polymer layer 114, whereas conductive through via(s) 120 connecting between the power plane 118 and one or more of the conductive pillars 106 may penetrate through the ground plane 116 as well as the top three polymer layers 114. In this way, the ground plane 116 may be discontinuous at the location(s) where the conductive through via(s) 120 connected to the power plane 118 extend(s) through, and may be regarded as having opening(s) through which this/these conductive through via(s) 120 penetrate(s). However, the ground plane 116 and the power plane 118 may otherwise be disposed at bottom surfaces of other polymer layers 114, as long as the ground plane 116 and the power plane 118 are overlapped with each other. Those skilled in the art may modify positions of the ground plane 116 and the power plane 118 as well as the length of the conductive through vias 120 according to design requirements, the present disclosure is not limited thereto.

In some embodiments, the semiconductor package 10 further includes a plurality of conductive patches 122 and inter-patch vias 124. The conductive patches 122 are disposed in the stack of polymer layers 114, and are located between and overlapped with the ground plane 116 and the power plane 118. In addition, the conductive patches 122 are laterally separated from one another. In those embodiments where the ground plane 116 and the power plane 118 are disposed at the bottom surfaces of the topmost and the third top polymer layers 114, the conductive patches 122 are periodically disposed at a bottom surface of the second top polymer layer 114. The inter-patch vias 124 penetrate through the polymer layer 114 sandwiched between the ground plane 116 and the conductive patches 122, and are respectively in electrical contact with one of the conductive patches 122 and a portion of the ground plane 116. One of the conductive patches 122 as well as the inter-patch via 124 and the portion of the ground plane 116 connecting to this conductive patch 122 form an inductor L. In addition, vertically overlapped portions of the conductive patches 122 and the ground plane 116 along with portions of the polymer layer 114 in between form capacitors C. The inductors L are electrically coupled to the capacitors C, and these inductors L and the capacitors C constitute passive resonators. The passive resonators are periodically arranged along one or more horizontal direction(s), and are configured to attenuate external noises carried along the power plane 118 and/or noises generated from the semiconductor die 100 without significantly affecting signals at other frequency ranges, so as to improve power integrity and to reduce electromagnetic interference. In other words, these passive resonators, which include the ground plane 116, the conductive patches 122, the inter-patch vias 124 and portions of the polymer layer 114 between the conductive patches 122 and the ground plane 116, function as a passive filter PF in the semiconductor package 10. As compared to forming a passive filter by patterning a single conductive layer (e.g., a power plane), the passive filter PF according to embodiments of the present disclosure includes vertically separated conductive layers (e.g., the conductive patches 122 and the ground plane 116), and may include conductive vias in between these conductive layers. As a result of such three-dimensional configuration, amount of the passive resonators can be increased without increasing total footprint area of the passive filter PF, thus the passive filter PF may have a better signal filtering ability in a given area. Particularly, coupling area of each capacitor C can be increased without increasing footprint area of the capacitors C because the conductive patches 122 and the ground plane 116 as components of the capacitors C are overlapped along a vertical direction. In addition, as a result of disposing the conductive patches 122 and the inter-patch vias 124, content of conductive materials in the stack of polymer layers 114 can be increased. Accordingly, heat dissipation efficiency of the semiconductor package 10 can be improved. Moreover, difference of coefficient of thermal expansion (CTE) between the semiconductor die 100 and the structure containing the polymer layers 114 and the conductive materials therein can be lowered, thus mechanical strength of the semiconductor package 10 can be improved.

Referring to FIG. 1B, the conductive patches 122 appeared as sheets are periodically arranged between the ground plane 116 and the power plane 118, and are connected to the ground plane 116 through the inter-patch vias 124. In some embodiments, the inter-patch vias 124 are also periodically arranged along one or more horizontal direction(s). In addition, the inter-patch vias 124 may be formed as pillars and respectively having a sectional area smaller than a footprint area of the conductive patch 122. In some embodiments, the footprint area of each conductive patch 122 may range from 0.09 mm$^2$ to 0.36 mm$^2$, whereas the sectional area of each inter-patch via 124 may range from $2.5\times10^{-3}$ mm$^2$ to $22.5\times10^{-3}$ mm$^2$. In addition, in some embodiments, a spacing $S_{122}$ between adjacent conductive patches 122 may range from 50 μm to 150 μm, and a spacing $S_{124}$ between adjacent inter-patch vias 124 may range from 100 μm to 250 μm. As an example, the conductive patches 122 are formed as rectangular sheets, and the inter-patch vias 124 are formed as cylindrical pillars. According to this example, a length $L_{122}$ of each conductive patch 122 along the first direction X may range from 50 μm to 150 μm, and a width $W_{122}$ of each conductive patch 122 along the second direction Y may range from 50 μm to 150 μm. In addition, a diameter $D_{124}$ of the inter-patch via 124 may range from 20 μm to 50 μm. However, those skilled in the art may modify shapes, spacing and dimensions of the conductive patches 122 and the inter-patch vias 124 according to design requirements, the present disclosure is not limited thereto.

Referring to FIG. 1A and FIG. 1C, in some embodiments, the conductive patches 122 and the inter-patch vias 124 spread over substantially the entire structure including the semiconductor die 100 and the encapsulant 102, and are located between globally disposed ground plane 116 and power plane 118. In these embodiments, the conductive patches 122 and the inter-patch vias 124 are overlapped with the semiconductor die 100 and the encapsulant 102. As shown in FIG. 1C, the conductive patches 122 and the inter-patch vias 124 are respectively arranged as an array, which has multiple rows extending along a first direction X and multiple columns extending along a second direction Y intersected with the first direction X. In alternative embodiments where the power plane 118 locally covers the structure including the semiconductor die 100 and the encapsulant 102, the conductive patches 122 and the inter-patch vias 124 may not be spread in an area outside the coverage of the power plane 118. However, those skilled in the art may adjust the coverage of the power plane 118, the conductive patches 122, the inter-patch vias 124 and the ground plane according to design requirements, the present disclosure is not limited thereto.

Referring back to FIG. 1A, the semiconductor package 10 may further include redistribution elements 126. The redistribution elements 126 are disposed in the stack of polymer layers 124, and are overlapped with the semiconductor die 100 and the encapsulant 102. The redistribution elements 126 are configured to out-rout the semiconductor die 100, and the working voltage V and the reference voltage $V_R$ may be provided to the power plane 118 and the ground plane 116 through the redistribution elements 126. In some embodiments, the redistribution elements 126 are located below the ground plane 116, the power plane 118, the conductive patches 122 and the inter-patch vias 124. In these embodiments, the ground plane 116, the power plane 118, the conductive patches 122 and the inter-patch vias 124 are located between the redistribution elements 126 and the structure containing the semiconductor die 100 and the encapsulant 102. In addition, the redistribution elements 126 may be electrically connected to some of the conductive pillars 106 by conductive through vias 128. The conductive through vias 128 may penetrate through the power plane 118 and the ground plane 116, and are connected between some of the conductive pillars 106 and the redistribution elements 126. In this way, the ground plane 116 and the power plane 118 may be discontinuous at the locations where the conductive through vias 128 extend through, and may be regarded as having openings through which these conductive vias 128 penetrate. The redistribution elements 126 may include conductive traces and conductive vias. Each conductive trace extends along a bottom surface of one of the polymer layers 114. Each conductive via penetrates through one or more of the polymer layers 114, and electrically connects to one or more of the conductive trace(s). In some embodiments, one or more of the topmost conductive via(s) of the redistribution elements 126 further extend(s) to the power plane 118. Moreover, one or more of the topmost conductive via(s) in the redistribution elements 126 may further extend to the conductive patches 122 through the power plane 118, so as to be in electrical contact with the ground plane 116 connected to the conductive patches 122 through the inter-patch vias 124.

In alternative embodiments, the ground plane 116, the power plane 118, the conductive patches 122 and the inter-patch vias 124 are located between top and bottom portions of the redistribution elements 126. In these alternative embodiments, the conductive through vias 128 penetrating through the ground plane 116 and the power plane 118 may be connected between the top and bottom portions of the redistribution elements 126, and the top and bottom portions of the redistribution elements 128 may be electrically connected to the ground plane 116 and the power plane 118 by some of the conductive vias in the top and bottom portions of the redistribution elements 126. Those skilled in the art may adjust vertical position of the ground plane 116, the power plane 118, the conductive patches 122 and the inter-patch vias 124 according to design requirements, the present disclosure is not limited thereto.

In some embodiments, the semiconductor package 10 further includes electrical connectors 130. The electrical connectors 130 are disposed at a surface of the stack of polymer layer 114 facing away from the semiconductor die 100 and the encapsulant 102 (e.g., a bottom surface of the stack of polymer layers 114), and are electrically connected to the electrical components formed in the stack of polymer layers 114 (e.g., redistribution elements 126, the ground plane 116, the power plane 118, the conductive patches 122 and the inter-patch vias 124). Some of the electrical connectors 130 may be functioned as inputs/outputs (I/Os) of the semiconductor die 100, and others of the electrical connectors 130 may be coupled to the working voltage V and the reference voltage $V_R$. The electrical connectors 130 as the I/Os may be electrically connected to the semiconductor die 100 through the redistribution elements 126 and the conductive through vias 128, whereas the electrical connectors 130 coupled to the working voltage V and the reference voltage $V_R$ may be electrically connected to the power plane 118 and the ground plane 116 through the redistribution elements 126. In some embodiments, the bottommost polymer layer 114 has openings respectively overlapped with one of the bottommost redistribution elements 126, and the electrical connectors 130 placed at the bottom surface of the bottommost polymer layer 114 may extend into these openings to establish electrically contact with the bottommost redistribution elements 126. The electrical connectors 130 may be, for example, solder balls, controlled collapse chip connection (C4) bumps, microbumps, ball grid array (BGA) or the like. In some embodiments, under bump metallization (UBM) layers 132 may be disposed in the openings of the bottommost polymer layer 114 before the electrical connectors 130 are formed in these openings. In these embodiments, the UBM layers 132 are respectively located between one of the electrical connectors 130, the bottommost polymer layer 114 and one of the bottommost redistribution elements 126.

In some embodiments, the semiconductor package 10 may be further attached onto another package component through the electrical connectors 130. In these embodiments, the package component may be another semiconductor package, a package substrate (e.g., a printed circuit board (PCB)) or the like. Furthermore, in some embodiments, a top package component may be attached to the semiconductor package 10 from above, and a bottom package component may be attached with the electrical connectors 130 of the semiconductor package 10. In these embodiments, additional redistribution structure and electrical connectors (both not shown) may be formed on the back surface of the encapsulant 102 and the back side of the semiconductor die 100, and at least one through encapsulant via (not shown) may be formed in the encapsulant 102. The additional electrical connectors are disposed on a surface of the additional redistribution structure facing away from the semiconductor die 100 and the encapsulant 102, and are attached to the top package component. The through encapsulant via penetrates through the encapsulant 102, and is electrically connected to the redistribution elements in the additional redistribution structure and the redistribution elements 126 in the stack of polymer layers 114. By further combining the semiconductor package 10 with one or more package components, a three-dimensional package structure can be obtained. Moreover, the semiconductor package according to some embodiments is a fan-in semiconductor package, and the stack of polymer layers 114 and the electrical components therein (e.g., the ground plane 116, the power plane 118, the conductive patches 122 and the inter-patch vias 124) may not span from range of the semiconductor die to a fan-out area surrounding the semiconductor die 100. In these embodiments, the encapsulant 102 may be omitted.

Figure 2A:
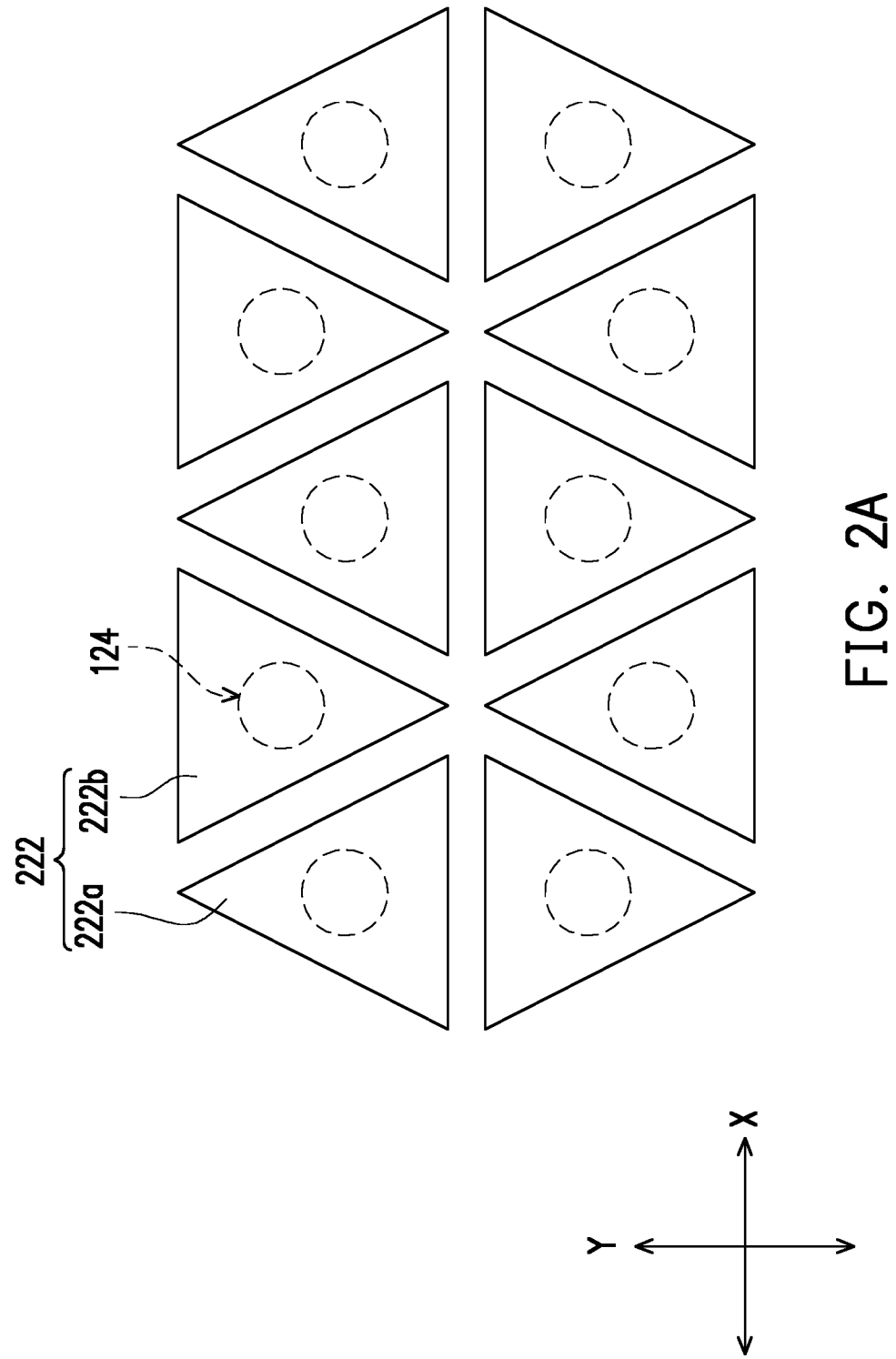
FIG. 2A and FIG. 2B are schematic plane views respectively illustrating some conductive patches of a semiconductor package according to some embodiments of the present disclosure.

FIG. 2A is a schematic plane view illustrating some conductive patches 222 of a semiconductor package according to some embodiments of the present disclosure. The semiconductor package having the conductive patches 222 as shown in FIG. 2A is similar to the semiconductor package 10 as shown in FIG. 1A through FIG. 1C. Only difference therebetween will be described, the same or the like parts would not be repeated again.

Referring to FIG. 2A, the conductive patches 222 are formed as triangular sheets. For instance, the triangular sheets 222 may have isosceles triangular top/bottom surfaces or equilateral triangular top/bottom surfaces. In some embodiments, the conductive patches 222 include first conductive patches 222a and second conductive patches 222b. The first conductive patches 222a may be in mirror symmetry to the second conductive patches 222b with respect to an axis extending along the first direction X. In other words, the first conductive patches 222a being flipped over this axis may be identical to the second conductive patches 222b. According to some embodiments, the first and second conductive patches 222a, 222b are alternately arranged along the first direction X and the second direction Y. In these embodiments, density of the conductive patches 222 in the semiconductor package can be increased.

Figure 2B:
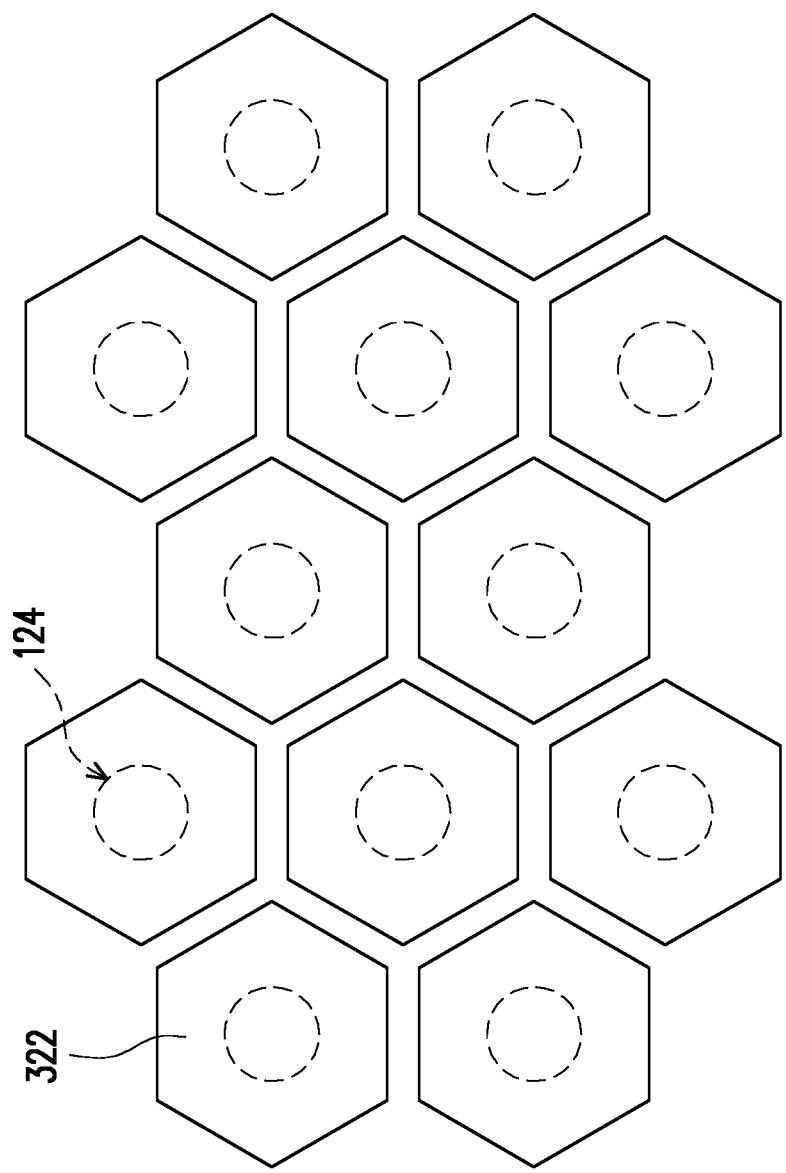

FIG. 2B is a schematic plane view illustrating some conductive patches 322 of a semiconductor package according to some embodiments of the present disclosure. The semiconductor package having the conductive patches 322 as shown in FIG. 2B is similar to the semiconductor package 10 as shown in FIG. 1A through FIG. 1C. Only difference therebetween will be described, the same or the like parts would not be repeated again.

Referring to FIG. 2B, the conductive patches 322 are formed as hexagonal sheets. For instance, the hexagonal sheets may have regular hexagonal top/bottom surfaces, which are respectively equilateral and equiangular. In some embodiments, the conductive patches 322 are arranged in a honeycomb arrangement. In these embodiments, density of the conductive patches 322 in the semiconductor package can be significantly increased.

Figure 3A:
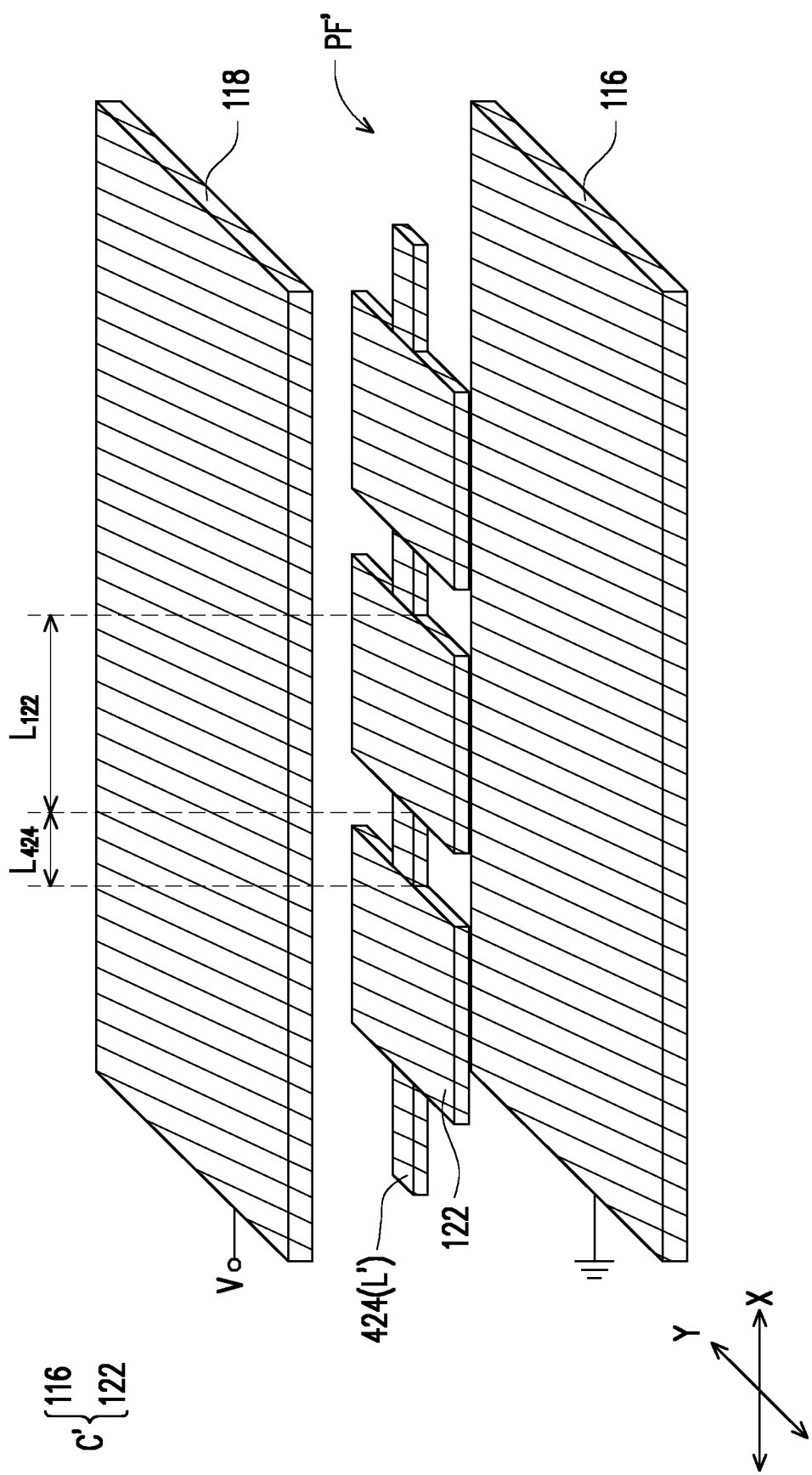
FIG. 3A and FIG. 3B are respectively a schematic three-dimensional view illustrating a ground plane, a power plane, conductive patches and conductive bridges according to some embodiments of the present disclosure.

FIG. 3A is a schematic three-dimensional view illustrating the ground plane 116, the power plane 118, the conductive patches 122 and conductive bridges 424 of a semiconductor package according to some embodiments of the present disclosure. This semiconductor package to be described with reference to FIG. 3A is similar to the semiconductor package 10 as shown in FIG. 1A through FIG. 1C. Only difference therebetween will be described, the same or the like parts would not be repeated again.

Referring to FIG. 3A, in some embodiments, the conductive patches 122 are connected with one another by conductive bridges 424, and the inter-patch vias 124 as shown in FIG. 1A and FIG. 1B are omitted. In these embodiments, the conductive patches 122 and the conductive bridges 424 may be electrically floated. In alternative embodiments, the conductive patches 122 and the conductive bridges 424 are configured to receive the working voltage V, and the power plane may be omitted. The conductive bridges 424 are respectively extending between adjacent conductive patches 122. Each conductive patch 122, an overlapped portion of the ground plane 116 and a portion of the polymer layer 114 (illustrated in FIG. 1A) in between form a capacitor C', whereas the conductive bridges 424 are functioned as inductors L' and are connected between the capacitors C'. As similar to the capacitors C and the inductors L as described with reference to FIG. 1A and FIG. 1B, the capacitors C' and the inductors L' as shown in FIG. 3A constitute passive resonators, and these passive resonators are periodically arranged to form a passive filter PF'. In some embodiments, each conductive bridge 424 extends between adjacent conductive patches 122 along a direction identical to the arrangement direction of these adjacent conductive patches 122. A ratio of a length $L_{424}$ of each conductive bridge 424 along its extending direction (e.g., the first direction X) with respect to a length of each conductive patch 122 along the same direction (e.g., the length $L_{122}$ along the first direction X) may range from 1/10 to 1/20. For instance, the length $L_{424}$ may range from 15 μm to 60 μm, while the length $L_{122}$ may range from 300 μm to 600 μm. Although not shown, in some embodiments, at least some of the conductive patches 122 may respectively be connected to conductive patches 122 along multiple directions (e.g., along the first direction X and the second direction Y) through multiple conductive bridges 424. In these embodiments, each of these conductive patches 122 is connected to conductive bridges 424 extending along multiple directions (e.g., the first direction X and the second direction Y).

Figure 3B:
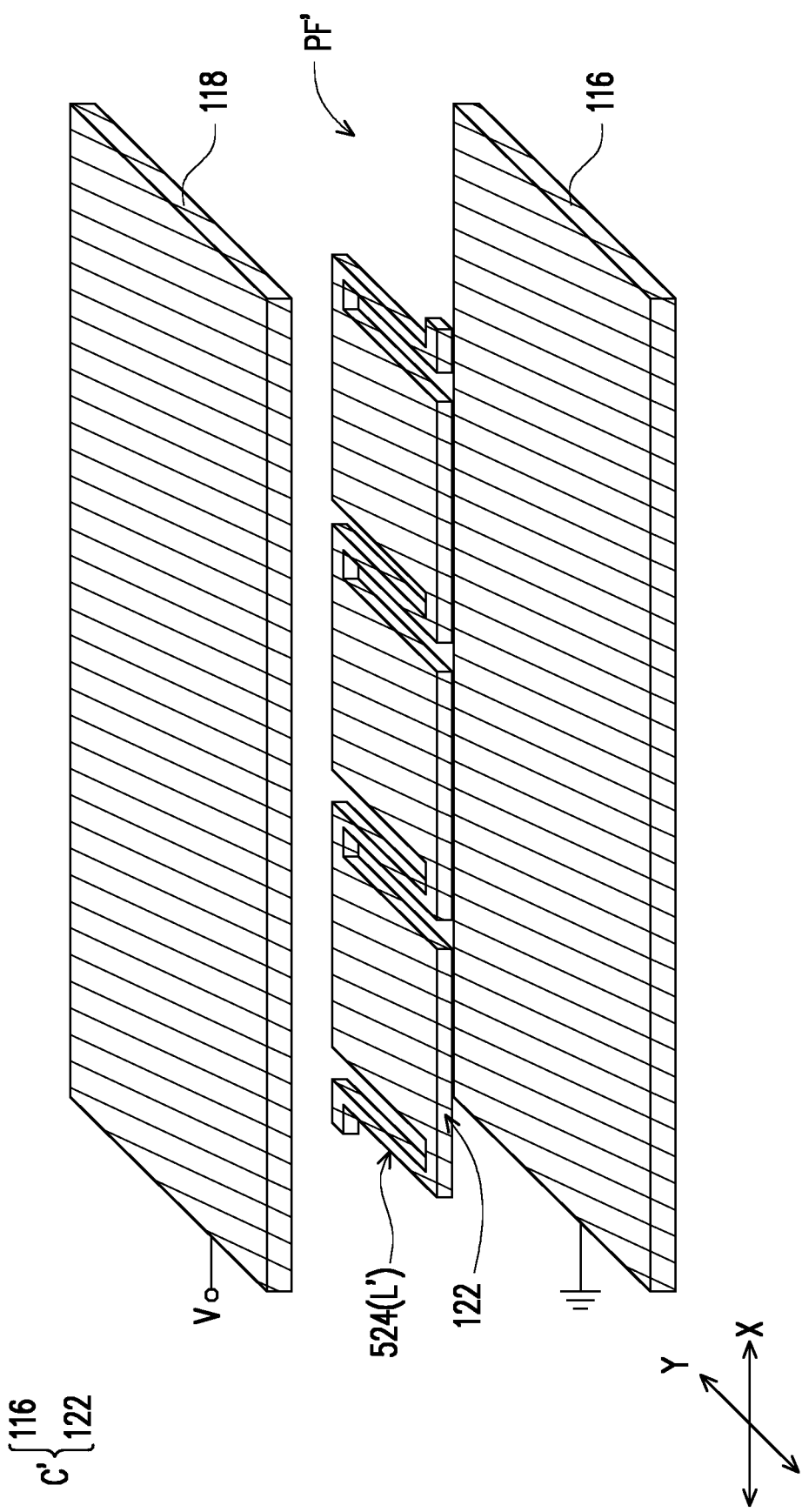

FIG. 3B is a schematic three-dimensional view illustrating the ground plane 116, the power plane 118, the conductive patches 122 and conductive bridges 524 of a semiconductor package according to some embodiments of the present disclosure. This semiconductor package to be described with reference to FIG. 3B is similar to the semiconductor package as described with reference to FIG. 3A. Only difference therebetween will be described, the same or the like parts would not be repeated again.

Referring to FIG. 3B, the conductive patches 122 are connected with one another by the conductive bridges 524. The conductive bridge 524 shown in FIG. 3B is longer than the conductive bridge 424 as shown in FIG. 3A. In this way, the conductive bridge 524 shown in FIG. 3B, which is as well functioned as an inductor (also referred as the inductor L'), could have an inductance greater than an inductance of the conductive bridge 424 as shown in FIG. 3A. As a result, the passive filter PF' including the ground plane 116, the conductive patches 122, the conductive bridges 524 and the polymer layer 114 (illustrated in FIG. 1A) in between the conductive patches 122 and the ground plane 116 could have a lower stopband (i.e., stopband at lower frequency range) as compared to the passive filter PF' described with reference to FIG. 3A. In some embodiments, each conductive bridge 524 meanders between adjacent conductive patches 122. For instance, as shown in FIG. 3B, each conductive bridge 524 may snake its path from one conductive patch 122 to another conductive patch 122, and may have one or more turning points (e.g., 2 turning points) along its pathway. Those skilled in the art may modify the shape of each conductive bridge 524 according to design requirements, the present disclosure is not limited thereto.

Figure 4:
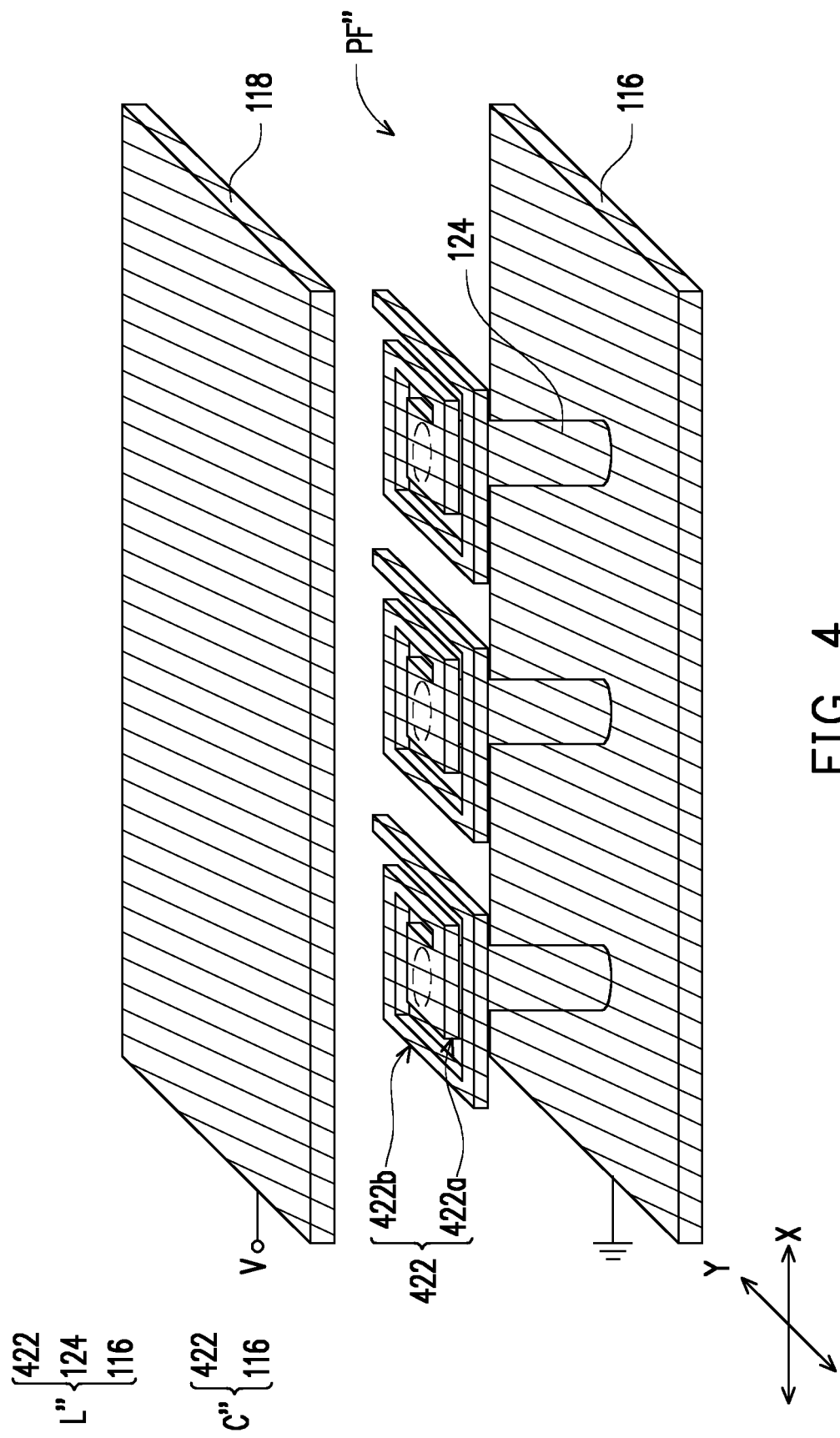
FIG. 4 is a schematic three-dimensional view illustrating a ground plane, a power plane, conductive patches and inter-patch vias according to some embodiments of the present disclosure.

FIG. 4 is a schematic three-dimensional view illustrating the ground plane 116, the power plane 118, conductive patches 422 and the inter-patch vias 124 according to some embodiments of the present disclosure. This semiconductor package to be described with reference to FIG. 4 is similar to the semiconductor package 10 as shown in FIG. 1A through FIG. 1C. Only difference therebetween will be described, the same or the like parts would not be repeated again.

Referring to FIG. 1B and FIG. 4, the conductive patches 122 shown in FIG. 1B are replaced by the conductive patches 422 as shown in FIG. 4. In some embodiments, each conductive patch 422 includes a patch portion 422a and a spiral portion 422b. The patch portion 422a is similar to the conductive patch 122 as shown in FIG. 1B, except that the patch portion 422a may have a smaller footprint are as compared to the conductive patch 122 as shown in FIG. 1B. In some embodiments, the patch portion 422a is connected to the ground plane 116 through one of the inter-patch via 124, and is overlapped with this inter-patch via 124 and a portion of the ground plane 116. On the other hand, the spiral portion 422b is connected to the patch portion 422a, and is winding around the patch portion 422a. In some embodiments, a total footprint area of the conductive patch 422 is substantially identical to the footprint area of the conductive patch 122 as shown in FIG. 1B. In these embodiments, a footprint area of the patch portion 422a may range from 0.09 mm² to 0.36 mm². However, those skilled in the art may adjust dimensions and patterns of the patch portion 422a and the spiral portion 422b according to design requirements, the present disclosure is not limited thereto.

One of the conductive patches 422 as well as the inter-patch via 124 and a portion of the ground plane 116 connecting to this conductive patch 422 forms an inductor L". In addition, vertically overlapped portions of the conductive patterns 422 and the ground plane 116 along with the polymer layer 114 (illustrated in FIG. 1A) in between form capacitors C". As similar to the capacitors C and the inductors L described with reference to FIG. 1A and FIG. 1B, the capacitors C" and the inductors L" as shown in FIG. 4 constitute passive resonators, and these passive resonators are periodically arranged to form a passive filter PF". Since the conductive pattern 422 has the spiral portion 422b, a length of the inductor L" could be increased, thus the inductor L" could have a greater inductance. As a result, the passive filter PF" illustrated in FIG. 4 could have a lower stopband (i.e., stopband at lower frequency range) as compared to the passive filter PF described with reference to FIG. 1B.

In some embodiments, the inter-patch vias 124 as shown in FIG. 4 may be omitted, and the passive filter PF" may further include the conductive bridges 424 as described with reference to FIG. 3A or the conductive bridge 524 as described with reference to FIG. 3B.

Figure 5:
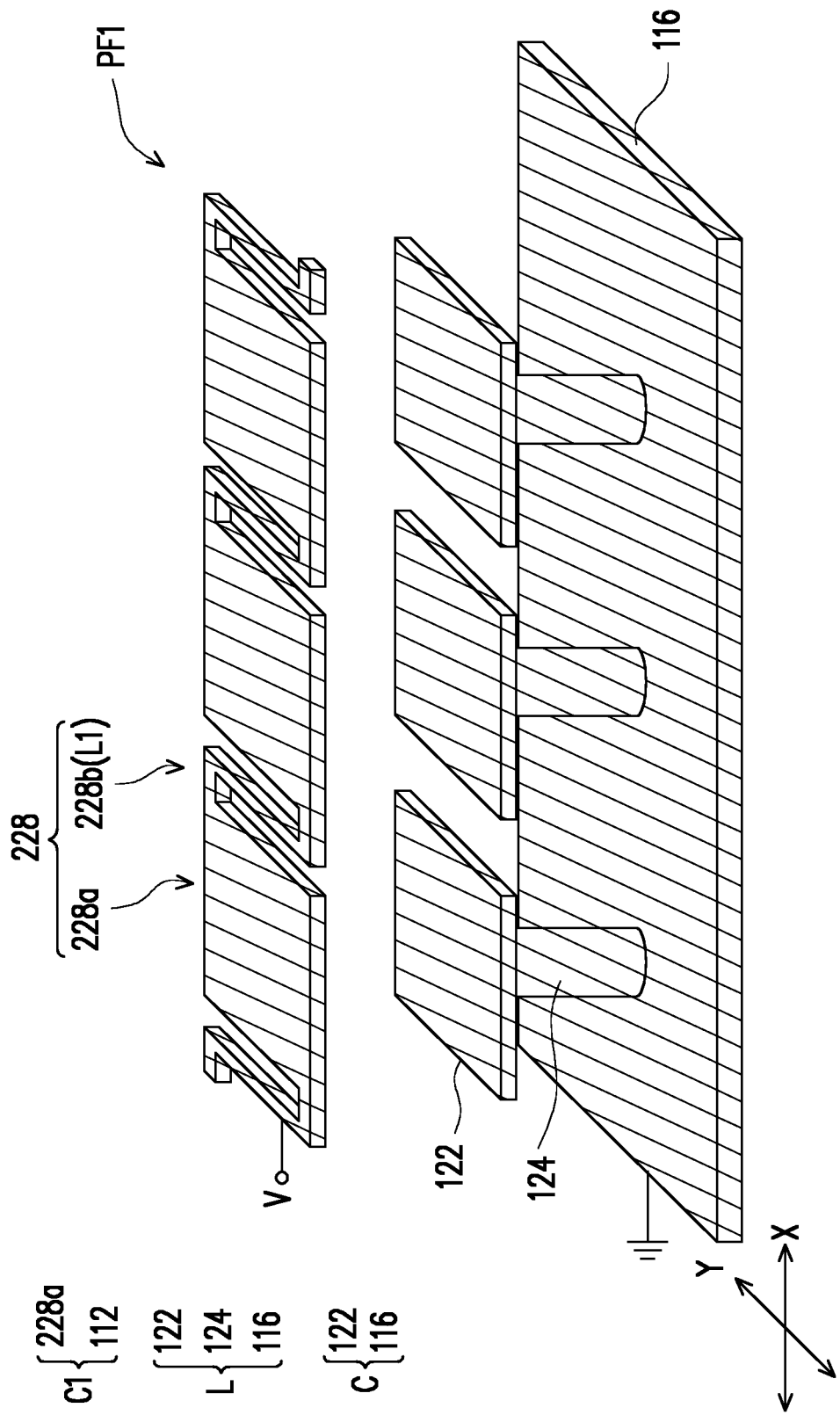
FIG. 5 is a schematic there-dimensional view illustrating a ground plane, a power pattern, conductive patches, and inter-patch vias according to some embodiments of the present disclosure.

FIG. 5 is a schematic there-dimensional view illustrating the ground plane 116, a power pattern 228, the conductive patches 122, and the inter-patch vias 124 according to some embodiments of the present disclosure. This semiconductor package to be described with reference to FIG. 5 is similar to the semiconductor package 10 as shown in FIG. 1A through FIG. 1C. Only difference therebetween will be described, the same or the like parts would not be repeated again.

Referring to FIG. 1B and FIG. 5, the power plane 118 shown in FIG. 1B is replaced by the power pattern 228 shown in FIG. 5. As similar to the power plane 118 described with reference to FIG. 1B, the power pattern 228 shown in FIG. 5 may be electrically coupled to the working voltage V (e.g., a DC voltage). In some embodiments, the power pattern 228 is structurally similar to the structure including the conductive patches 122 and the conductive bridges 524 as shown in FIG. 3B, but is located above/below the conductive patches 122 and separated from the conductive patches 122 by one or more of the polymer layers 114 (illustrated in FIG. 1A). In these embodiments, the power pattern 228 has patch portions 228a and bridge portions 228b connecting between the patch portions 228a. The patch portions 228a are structurally similar to the underlying conductive patches 122, and are overlapped with the conductive patches 122, respectively. In some embodiments, boundaries of the patch portions 228 are substantially aligned with boundaries of the conductive patches 122 along a vertical direction. On the other hand, the bridge portions 228b are structurally similar to the conductive bridges 524 shown in FIG. 3B that respectively meander between adjacent patch portions 228a. The power pattern 228, the conductive patches 122 and portions of the polymer layer 114 (illustrated in FIG. 1A) in between form additional capacitors C1, and the bridge portions 228b of the power pattern 228 are functioned as additional inductors L1. The capacitors C and the inductors L along with the additional capacitors C1 and the additional inductors L1 constitute passive resonators, and these passive resonators are periodically arranged to form a passive filter PF1. This passive filter PF1 as described with reference to FIG. 5 spans among 3 vertically separated conductive layers (e.g., the ground plane 116, the conductive patches 122 and the power pattern 228).

In alternative embodiments, the capacitors C and the inductors L as shown in FIG. 5 may be replaced by the capacitors C' and the inductors L' as shown in FIG. 3A, the capacitors C' and the inductors L' as shown in FIG. 3B, or the capacitors C" and the inductors L" as shown in FIG. 4. In addition, in some embodiments, the conductive patches 122 as shown in FIG. 5 may be replace by the conductive patches 422 as shown in FIG. 4. Moreover, in some embodiments, the power pattern 228 as shown in FIG. 5 may be replaced by the structure including the conductive patches 122 and the conductive bridges 424 as shown in FIG. 3A.

Figure 6:
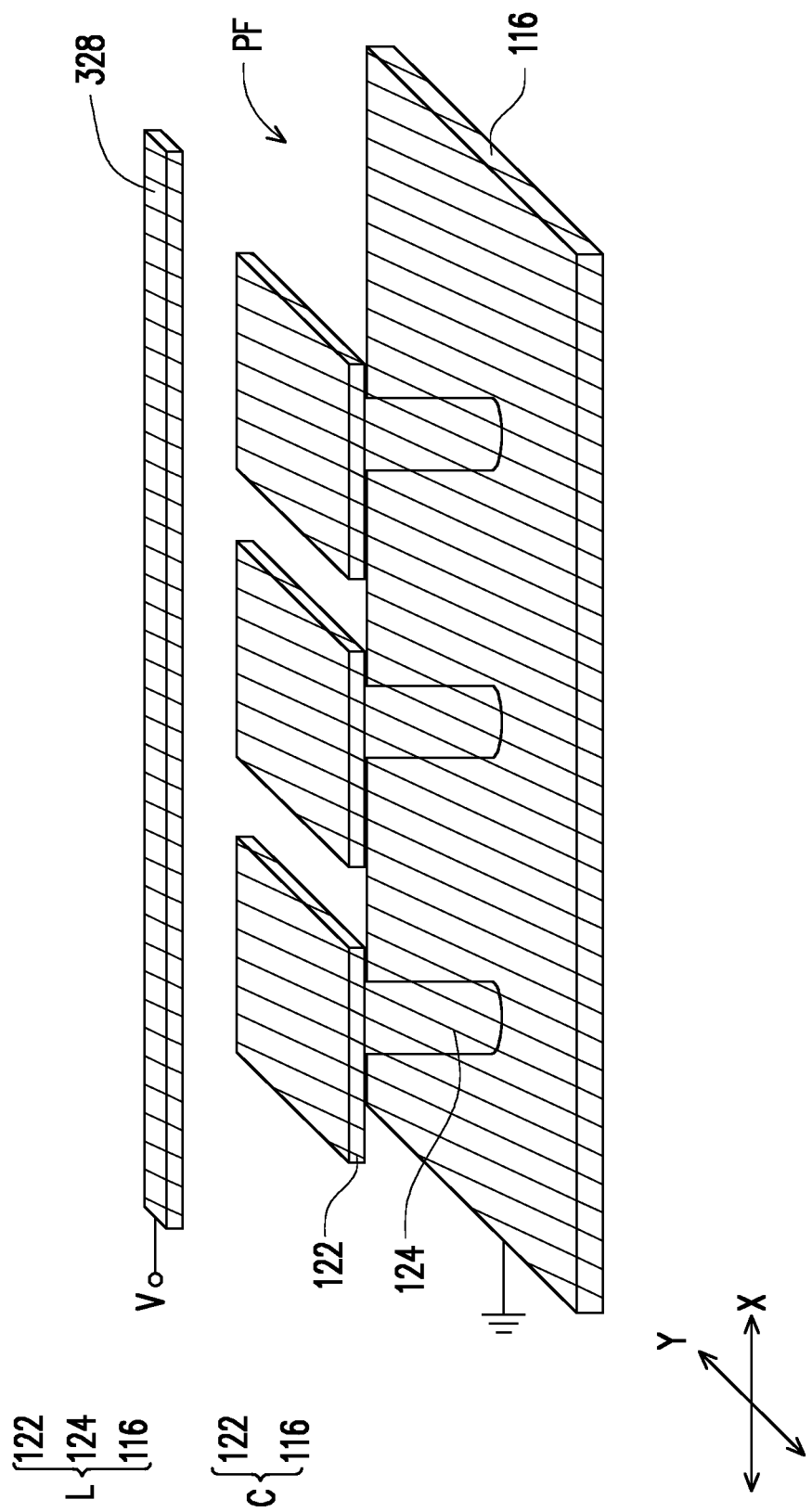
FIG. 6 is a schematic three-dimensional view illustrating a ground plane, a transmission line, conductive patches and inter-patch vias according to some embodiments of the present disclosure.

FIG. 6 is a schematic three-dimensional view illustrating the ground plane 116, a transmission line 328, the conductive patches 122 and the inter-patch vias 124 according to some embodiments of the present disclosure. This semiconductor package to be described with reference to FIG. 6 is similar to the semiconductor package 10 as shown in FIG. 1A through FIG. 1C. Only difference therebetween will be described, the same or the like parts would not be repeated again.

Referring to FIG. 1B and FIG. 6, the power plane 118 shown in FIG. 1B is replaced by the transmission line 328 shown in FIG. 6. The transmission line 328 is configured to carry signals to the semiconductor die 100 (illustrated in FIG. 1A), and the signals are such as alternating current (AC) signals AC. For instance, the transmission line 328 may be a portion of a signal line, an inductor, an antenna, a duplexer or the like. The transmission line 328 is overlapped with the conductive patches 122 from above the conductive patches 122, and is vertically separated from the conductive patches 122 by one or more of the polymer layers 114 (illustrated in FIG. 1A). The passive filter PF including the capacitors C and the inductors L can result in slow-wave effect on the signal transmission along the transmission line 328, such that equivalent wavelength of the signals could be increased. As a result, dimensions of the transmission line 328 can be scaled down. For instance, a length of the transmission line 328 may be reduced by 30% to 60%. In some embodiments, the conductive patches 122 and the inter-patch vias 124 may not spread all over the semiconductor package, but merely lie under the transmission line 328. However, those skilled in the art may modify distribution area of the conductive patches 122 and the inter-patch vias 124 according to design requirements, the present disclosure is not limited thereto.

In alternative embodiments, the capacitors C and the inductors L as shown in FIG. 6 may be replaced by the capacitors C' and the inductors L' as shown in FIG. 3A, the capacitors C' and the inductors L' as shown in FIG. 3B, or the capacitors C" and the inductors L" as shown in FIG. 4. In addition, in some embodiments, the conductive patches 122 as shown in FIG. 6 may be replace by the conductive patches 422 as shown in FIG. 4.

Figure 7:
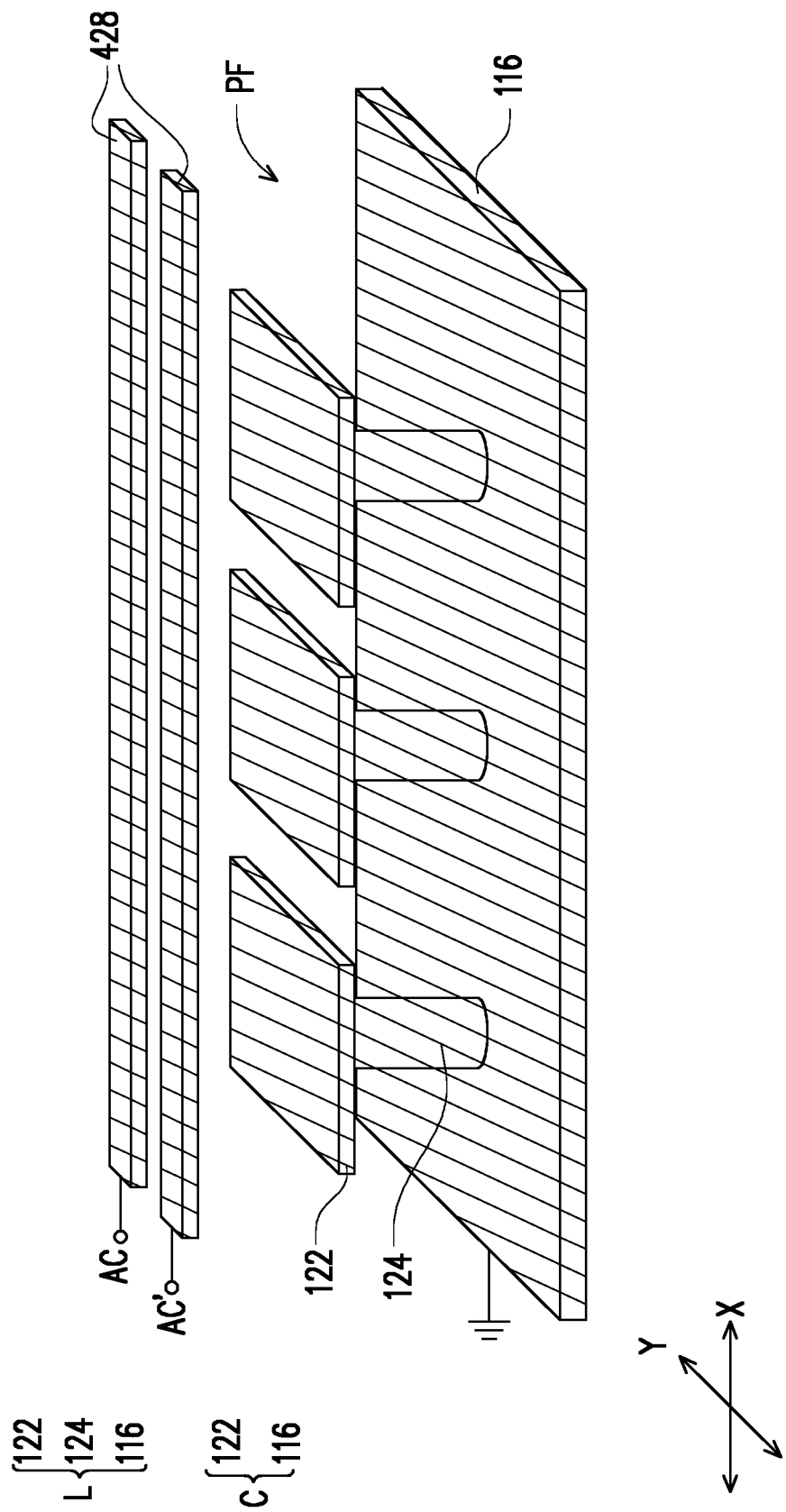
FIG. 7 is a schematic three-dimensional view illustrating a ground plane, a pair of transmission lines, conductive patches and inter-patch vias according to some embodiments of the present disclosure.

FIG. 7 is a schematic three-dimensional view illustrating the ground plane 116, a pair of transmission lines 428, the conductive patches 122 and the inter-patch vias 124 according to some embodiments of the present disclosure. This semiconductor package to be described with reference to FIG. 7 is similar to the semiconductor package 10 as shown in FIG. 1A through FIG. 1C. Only difference therebetween will be described, the same or the like parts would not be repeated again.

Referring to FIG. 1B and FIG. 7, the power plane 118 shown in FIG. 1B is replaced by a pair of transmission lines 428 shown in FIG. 7. The pair of transmission lines 428 are configured to provide AC signals AC, AC' to the semiconductor die 100 (illustrated in FIG. 1A) through a differential signaling manner for improving noise immunity, and these AC signals AC, AC' are merely different from each other as having different phases. As similar to the transmission line 328 described with reference to FIG. 6, in some embodiments, the pair of transmission lines 428 shown in FIG. 7 are overlapped with the conductive patches 122 from above the conductive patches 122, and are vertically separated from the conductive patches 122 by one or more of the polymer layers 114 (illustrated in FIG. 1A). By disposing the passive filter PF including the capacitors C and the inductors L under the pair of transmission lines 428, a common-mode noise of the transmission lines 428 may be reduced. Accordingly, signal integrity can be improved, and electromagnetic interference can be reduced. In some embodiments, the conductive patches 122 and the inter-patch vias 124 may not spread all over the semiconductor package, but merely lie under the pair of transmission lines 428. However, those skilled in the art may modify distribution area of the conductive patches 122 and the inter-patch vias 124 according to design requirements, the present disclosure is not limited thereto.

In alternative embodiments, the capacitors C and the inductors L as shown in FIG. 7 may be replaced by the capacitors C' and the inductors L' as shown in FIG. 3A, the capacitors C' and the inductors L' as shown in FIG. 3B, or the capacitors C" and the inductors L" as shown in FIG. 4. In addition, in some embodiments, the conductive patches 122 as shown in FIG. 7 may be replace by the conductive patches 422 as shown in FIG. 4.

As above, the semiconductor package according to embodiments of the present disclosure includes a passive filter integrated in a redistribution structure. The passive filter is configured to improve signal integrity, to enhance power integrity and/or to reduce electromagnetic interference of the semiconductor package. The passive filter includes the ground plane, the conductive patches overlapped with the ground plane along the vertical direction, and a polymer layer between the ground plane and the conductive patches, thus is a three-dimensional passive filter containing vertically separated conductive layers. In some embodiments, the inter-patch vias are connecting between the conductive patches and the ground plane. In alternative embodiments, the conductive patches are electrically floated, and are connected to one another by the conductive bridges. The conductive bridges or the conductive patches along with the inter-patch vias and the ground plane form inductors, whereas the overlapped portions of the conductive patches and the ground plane as well as the polymer layer in between form capacitors. The inductors and the capacitors constitute passive resonators, and the periodically arranged passive resonators constitute the passive filter. As compared to forming a passive filter by patterning a single conductive layer, the three-dimensional passive filter according to embodiments of the present disclosure may have more of the passive resonators, thus may have a better signal filtering ability in a given area. Particularly, coupling area of each capacitor can be increased without increasing footprint area of the capacitors because the conductive patches and the ground plane as components of the capacitors are overlapped with each other along the vertical direction. In addition, as a result of disposing the conductive patches and the inter-patch vias (or the conductive bridges), content of conductive materials in the redistribution structure can be increased. Accordingly, heat dissipation efficiency of the semiconductor package can be improved. Moreover, CTE difference between the semiconductor die and the redistribution structure can be lowered, thus mechanical strength of the semiconductor package can be improved.

In an aspect of the present disclosure, a semiconductor package is provided. The semiconductor package comprises: a semiconductor die; a stack of polymer layers, covering a front surface of the semiconductor die; redistribution elements, disposed in the stack of polymer layers, and electrically connected to the semiconductor die; and a passive filter, disposed in the stack of polymer layers, wherein the passive filter comprises a ground plane and conductive patches, the ground plane is overlapped with the conductive patches along the vertical direction, the conductive patches are laterally separated from one another, the ground plane is electrically coupled to a reference voltage, and the conductive patches are electrically connected to the ground plane, electrically floated or electrically coupled to a direct current (DC) voltage.

In another aspect of the present disclosure, a semiconductor package is provided. The semiconductor package comprises: a semiconductor die; and a passive filter, disposed over a front surface of the semiconductor die, and comprising a power pattern, a ground plane and conductive patches, wherein the ground plane is overlapped with the power pattern along a vertical direction, the conductive patches are periodically arranged between the ground plane and the power pattern, the power pattern is electrically coupled to a direct current voltage, the ground plane is electrically coupled to a reference voltage, and the conductive patches are electrically connected to the ground plane or electrically floated.

In yet another aspect of the present disclosure, a semiconductor package is provided. The semiconductor package comprises: a semiconductor die; a transmission line, horizontally extending over a front surface of the semiconductor die, and configured to provide an alternating current signal to the semiconductor die; and a passive filter, overlapped with the transmission line along a vertical direction, wherein the passive filter comprises a ground plane and conductive patches, the ground plane is overlapped with the transmission line along the vertical direction, the conductive patches are periodically arranged between the ground plane and the transmission line, the ground plane is electrically coupled to a reference voltage, and the conductive patches are electrically connected to the ground plane or electrically floated.

It should be appreciated that the following embodiment(s) of the present disclosure provides applicable concepts that can be embodied in a wide variety of specific contexts. The embodiments are intended to provide further explanations but are not used to limit the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
an encapsulated structure, comprising a semiconductor die and an encapsulant laterally encapsulating the semiconductor die;
electrical connectors as inputs/outputs of the semiconductor package, deployed at a front side of the encapsulated structure;
a circuit layer, lying between the encapsulated structure and the electrical connectors; and
a passive filter, embedded in the circuit layer, and comprising:
a ground plane, electrically coupled to a reference voltage;
a power plane, overlapping the ground plane, wherein a power signal is delivered to the semiconductor die through the power plane; and
conductive patches, arranged as an array between the ground plane and the power plane, and are electrically connected to the ground plane.

2. The semiconductor package according to claim 1, wherein the conductive patches are electrically connected to the ground plane through inter-patch vias, respectively.

3. The semiconductor package according to claim 1, wherein the conductive patches are entirely overlapped with the ground plane and the power plane.

4. The semiconductor package according to claim 1, wherein the conductive patches are each smaller in footprint area as compared to each of the ground plane and the power plane, and are laterally spaced apart from one another.

5. The semiconductor package according to claim 1, wherein the conductive patches are each formed as a rectangular pattern, a triangular pattern or a hexagonal pattern.

6. The semiconductor package according to claim 1, wherein the conductive patches each have a patch portion and a spiral portion winding around the patch portion and connected to the patch portion by one end.

7. The semiconductor package according to claim 6, wherein inter-patch vias configured to establish an electrical connection between the conductive patches and the ground plane extend from the ground plane to the patch portions of the conductive patches, respectively.

8. The semiconductor package according to claim 1, wherein the ground plane, the conductive patches and the power plane are overlapped with the semiconductor die and the encapsulant.

9. The semiconductor package according to claim 1, wherein sidewalls of the encapsulated structure are substantially aligned with sidewalls of the circuit layer.

10. The semiconductor package according to claim 1, wherein the circuit layer comprises conductive traces and conductive vias spreading at a single side or opposite sides of the passive filter, and configured to establish electrical connections between the respective electrical connectors and the passive filter, between the respective electrical connectors and the semiconductor die, and between the passive filter and the semiconductor die.

11. The semiconductor package according to claim 10, wherein the passive filter, the conductive traces and the conductive vias are distributed in a stack of polymer layers.

12. A semiconductor package, comprising:
an encapsulated structure, comprising a semiconductor die and an encapsulant laterally encapsulating the semiconductor die;
a circuit layer, extending along a front surface of the encapsulated structure;

a passive filter, embedded in the circuit layer, and comprising:
  a ground plane, overlapped with the semiconductor die and the encapsulant, and electrically coupled to a reference voltage;
  a power plane overlapping the ground plane, wherein a power signal is delivered to the semiconductor die through the power plane; and
  conductive patches, separately arranged as an array between the ground plane and the power plane, and electrically floated; and
electrical connectors, disposed at a side of the circuit layer facing away from the encapsulated structure.

13. The semiconductor package according to claim 12, wherein the conductive patches are connected with one another.

14. The semiconductor package according to claim 12, wherein the passive filter further comprises:
  conductive bridges, each connecting one of the conductive patches to another.

15. The semiconductor package according to claim 14, wherein each of the conductive bridges extends along a single direction.

16. The semiconductor package according to claim 14, wherein each of the conductive bridges meanders between adjacent ones of the conductive patches.

17. The semiconductor package according to claim 16, wherein each of the conductive bridges extend along at least two different directions.

18. A semiconductor package, comprising:
  an encapsulated structure, comprising a semiconductor die and an encapsulant laterally encapsulating the semiconductor die;
  electrical connectors, deployed at a front side of the encapsulated structure;
  a circuit layer, lying between the encapsulated structure and the electrical connectors; and
  a passive filter, embedded in the circuit layer, and comprising
    a ground plane, electrically coupled to a reference voltage;
    a power pattern, entirely overlapped with the ground plane and having patch portions laterally separated yet connected with one another, wherein a power signal is delivered to the semiconductor die through the power pattern; and
    conductive patches, arranged as an array between the ground plane and the power plane, and are electrically connected to the ground plane through inter-patch vias, respectively.

19. The semiconductor package according to claim 18, wherein the power pattern further has bridge portions each connecting one of the patch portions to another.

20. The semiconductor package according to claim 18, wherein the patch portions of the power pattern are each smaller in footprint area as compared to the ground plane, and are each overlapped with one of the conductive patches.

* * * * *